United States Patent
Nishiwaki

(10) Patent No.: US 6,515,694 B1
(45) Date of Patent: Feb. 4, 2003

(54) ILLUMINATION DEVICE AND OPTICAL PROCESSING APPARATUS USING THE SAME

(75) Inventor: Masayuki Nishiwaki, Yoshikawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/565,478

(22) Filed: May 5, 2000

(30) Foreign Application Priority Data

May 10, 1999 (JP) ............................................ 11-128826

(51) Int. Cl.⁷ ............................................... B41J 27/00
(52) U.S. Cl. ...................................... 347/241; 347/256
(58) Field of Search ................................ 347/224, 225, 347/241, 256; 355/46, 67; 219/121.7, 121.19, 121.4, 121.6, 121.73, 121.75

(56) References Cited

U.S. PATENT DOCUMENTS

| | | | |
|---|---|---|---|
| 4,733,944 A | 3/1988 | Fahlen et al. ............... 359/624 |
| 4,851,882 A | * 7/1989 | Takahashi et al. ............ 355/46 |
| 5,724,122 A | * 3/1998 | Oskotsky ..................... 355/67 |
| 5,963,305 A | * 10/1999 | Mizouchi ...................... 355/67 |
| 6,303,900 B1 | * 10/2001 | Tachikawa ............... 219/121.7 |

FOREIGN PATENT DOCUMENTS

JP          8-257770          10/1996

* cited by examiner

*Primary Examiner*—Hai Pham
(74) *Attorney, Agent, or Firm*—Fitzpatrick, Cella, Harper & Scinto

(57) ABSTRACT

An illumination system for illuminating a particular surface, to be illuminated, with light from a light source, includes a first optical component having an optical power with respect to a predetermined plane, and a second optical component having an optical power with respect to the predetermined plane, wherein the particular surface is illuminated through Koehler illumination with respect to a plane orthogonal to the predetermined plane and is illuminated approximately through critical illumination with respect to the predetermined plane, wherein the first and second optical components are adapted to provide an afocal system, and wherein the condition for the afocal system is disconnected when a relative position between the first and second optical components is changed, whereby an illumination range with respect to the predetermined plane, upon the particular surface, is changed.

9 Claims, 3 Drawing Sheets

ILLUMINATION DEVICE AND OPTICAL PROCESSING APPARATUS USING THE SAME

FIELD OF THE INVENTION AND RELATED ART

This invention relates to an illumination system and an optical processing apparatus using the same. More particularly, the present invention is suitably usable in a microprocessing procedure wherein coherent light of a linear beam is projected to a workpiece to produce therein, for example, a pattern of a periodic structure having plural openings during the manufacture of an orifice plate for use in a ink-jet type printer.

The optical processing technology using coherent light such as light from an excimer laser, for example, has been used in many applications together with mechanical processings or chemical-reaction applied processings, for example. Particularly, in accordance with recent technology renovations, conditions such as material, optical technology, and production technology, for example, are well-ordered, and the optical processing procedure based on coherent light is used frequently in the field of microprocessing.

Many types of optical processing apparatuses have been proposed for production of an orifice plate, by using laser processing on the basis of a mask projection method. As regards an illumination optical system (illumination system) for use in such optical processing apparatuses, a Koehler illumination system has been proposed in an attempt to illuminate a mask uniformly. Further, there are many other proposals for an illumination optical system wherein, for illuminating a mask with linear light, a Koehler illumination system is defined with respect to a lengthwise direction of the mask while a critical illumination system is defined with respect to a widthwise direction thereof. U.S. Pat. No. 4,733,944 proposes an optical system wherein a pair of orthogonal cylindrical lenticulars are used to vary an illumination region upon the surface of a workpiece. Japanese Laid-Open Patent Application No. 257770/1996 proposes a structure wherein optical systems, which are independent from each other are disposed in relation to a lengthwise direction and a widthwise direction, are provided to illuminate a mask.

In these illumination systems, laser light is directly collected with respect to the widthwise direction. This causes an inconvenience that the processing phenomenon changes if the position of the mask with respect to the widthwise direction changes. The illumination system using orthogonal cylindrical lenticulars as proposed in U.S. Pat. No. 4,733, 944 mentioned above, has no concern about the operation in a region where the aspect ratio of the illumination range (i.e., the ratio regarding the lengthwise direction and the widthwise direction thereof) is not less than 50 and not greater than about 90. Further, in the two orthogonal directions, the same illumination method is used. That is, by changing the interval between the pair of orthogonal cylindrical lenticular lenses, the illumination range upon the surface to be illuminated is changed without changing the aspect ratio. In the structure of U.S. Pat. No. 4,733,944, therefore, it is not attainable to change the illumination range only in one direction, that is, horizontal direction or longitudinal direction on the surface to be illuminated. Thus, the aspect ratio can not be changed.

SUMMARY OF THE INVENTION

It is an object of the present invention to provide an illumination system and/or an optical processing apparatus using the same, by which an illumination region can be illuminated uniformly and by which the illumination region can be changed only in one direction to thereby change the aspect ratio, such that a workpiece can be processed more easily and more precisely.

In accordance with an aspect of the present invention, there is provided an illumination system for illuminating a particular surface, to be illuminated, with light from a light source, the illumination system including a first optical component having an optical power with respect to a predetermined plane and a second optical component having an optical power with respect to the predetermined plane. The particular surface is illuminated through Koehler illumination with respect to a plane orthogonal to the predetermined plane and is illuminated approximately through critical illumination with respect to the predetermined plane. The first and second optical components are adapted to provide an afocal system and the condition for the afocal system is disconnected when a relative position between the first and second optical components is changed, whereby an illumination range with respect to the predetermined plane, upon the particular surface, is changed.

In accordance with another aspect of the present invention, there is provided an optical processing apparatus including illumination means including an illumination system as recited above, for illuminating a mask having a pattern and projection means for projecting the illuminated pattern of the mask onto a substrate, for processing the same.

In accordance with a further aspect of the present invention, there is provided a method of manufacturing an orifice plate, including the steps of loading a substrate in an optical processing apparatus as recited above and illuminating a mask having a plurality of openings arrayed along a certain direction, so that the pattern is projected onto the substrate to produce plural openings therein.

In accordance with a yet further aspect of the present invention, there is provided an ink-jet printer including an orifice plate as produced in accordance with an orifice plate manufacturing method as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
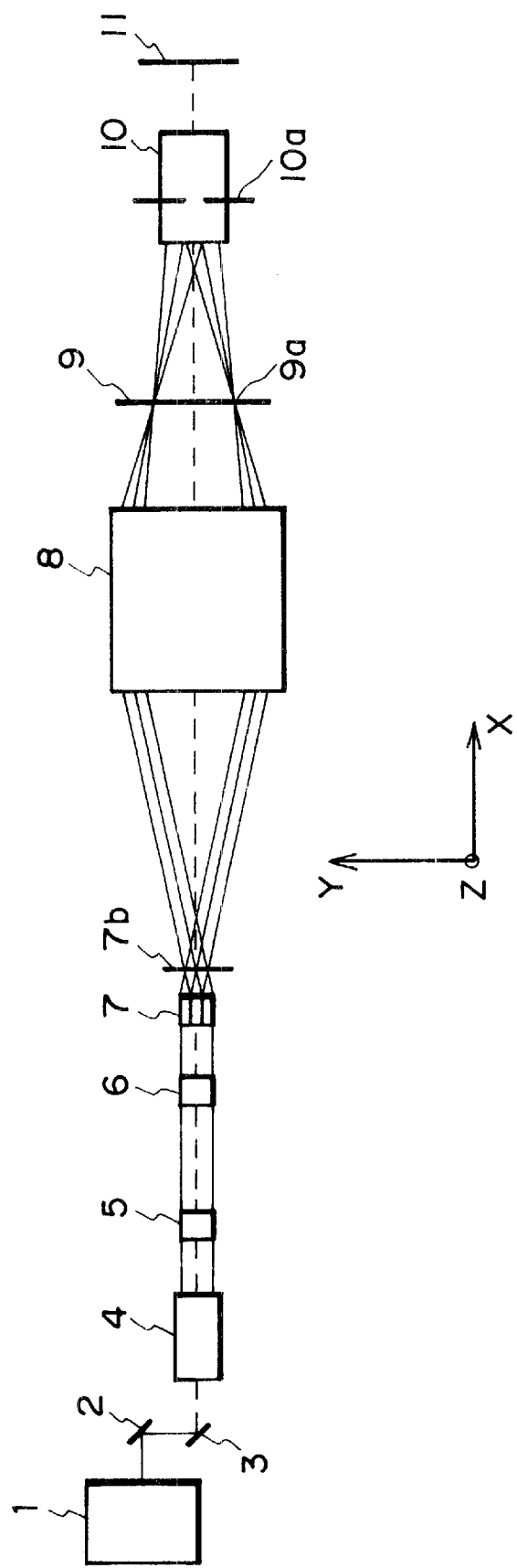
FIG. 1 is a schematic and plan view of a main portion of an optical processing apparatus having an illumination system according to a first embodiment of the present invention.
Figure 2:
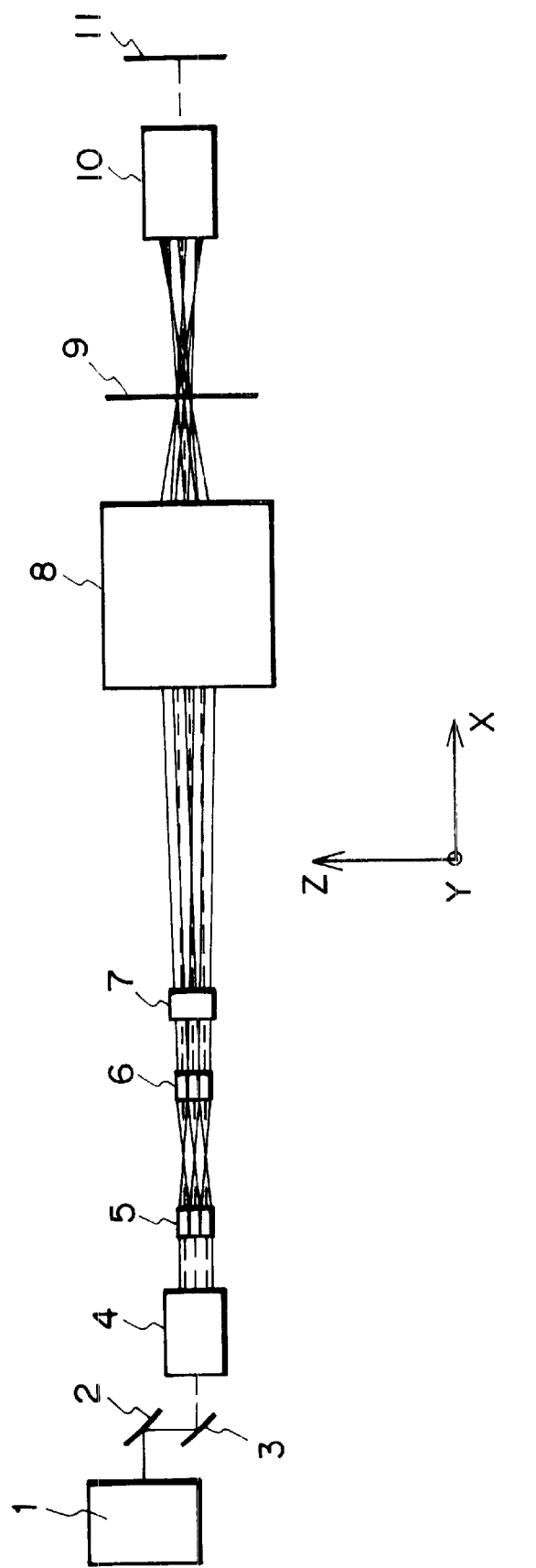
FIG. 2 is a schematic and side view of the main portion of the first embodiment.

FIG. 1 is a schematic and plane view (X-Y section) of a main portion of an optical processing apparatus having an illumination system according to a first embodiment of the present invention. FIG. 2 is a schematic and side view (Z-X section) of the processing apparatus of the first embodiment. The processing apparatus of this embodiment is used to perform abrasion processing for forming parallel grooves (each having a very short length) on a workpiece. In this embodiment, an optical axis of a projection lens 10, to be described later, is taken as the X axis, a direction along which a mask pattern 9a of a mask 9 is arrayed is taken as the Y axis (lengthwise direction), and a direction orthogonal to the X and Y axes is taken as the Z axis (widthwise direction). FIG. 1 is taken along the X-Y section (first plane), and FIG. 2 is taken along the X-Z section (second plane).

Denoted in the drawings at 1 is a laser light source which comprises an excimer laser, for example. It produces coherent light of an intense power. Denoted at 2 and 3 are mirrors for reflectively deflecting light from the light source 1 so that the lengthwise direction of the laser light is registered with the lengthwise direction of the mask 9, to be described later. Denoted at 4 is an enlargement optical system having different refractive indices with respect to the X-Y section and the X-Z section. It functions to enlarge the diameter of light incident thereon, only in one direction, such that approximately the same light beam diameter is accomplished with respect to both of the X-Y section and the X-Z section.

Denoted at 5 is a light dividing element as a first optical element, and denoted at 6 is a light dividing element as a second optical element. Each of these optical elements comprises a plurality of cylindrical lenses each having a refractive power only with respect to the X-Z section. The cylindrical lenses are arrayed along the Z direction, such that the light incident thereon is divided with respect to the X-Z section, into plural light beams (of an odd number of three, in this example). Denoted at 7 is a light dividing element as a third optical element. It comprises a plurality of cylindrical lenses each having a refractive power only with respect to the X-Y section. The cylindrical lenses are arranged along the Y direction, such that the light incident thereon is divided with respect to the X-Y section, into plural light beams (of an odd number of three, in this example).

Denoted at 8 is a lens system for illuminating the mask 9 with light from the third light dividing element 7. These components which are denoted at 2–8 constitute an optical system which is a portion of the illumination system. Also, the elements 5, 6 and 7 are components of light dividing means.

The mask 9 has a pattern (mask pattern) 9a arrayed along the Y direction, for the optical processing of a workpiece 11, for production of an orifice plate, for example. The mask 9 comprises an opaque background on which a large number of transmissive slits being elongated in the Z direction (but having a length of very small absolute value) are formed, whereby the mask pattern is defined. Thus, apparently, the mask pattern 9a may look as a straight line extending in the Y direction. The mask 9 is set at a focal point position of the lens system 8.

Denoted at 10 is a projection lens for imaging the mask pattern 9a of the mask 9 upon the surface of the workpiece 11 to be processed. With the image of the mask pattern 9a thus formed on the surface of the workpiece 11 to be processed, the optical processing of that surface is carried out.

Denoted at 10a is a stop (entrance pupil) of the projection lens 10. In this embodiment, with respect to the X-Y section, the entrance pupil 10a of the projection lens 10 and a rear focal point 7b which is defined by light source images as produced by the third light dividing element 7, are placed in an optically conjugate relationship with each other.

The optical actions in this embodiment will be described in relation to the X-Y plane of FIG. 1 and the X-Z plane of FIG. 2, separately.

In the X-Y plane of FIG. 1, parallel laser light emitted from the laser light source 1 is reflected by the mirrors 2 and 3 and, then, it enters the enlargement optical system 4. No optical action is applied to the light, by this enlargement optical system 4, and the light enters the first, second and third light dividing elements 5, 6 and 7, sequentially. Among them, no optical action is applied to the light by the first and second light dividing elements 5 and 6. With the third light dividing element 7, in response to the approximately parallel light incident thereon, a plurality of light source images are produced at its rear focal point position 7b. The lens system 8 has a function for projecting these light source images, defined by the third light dividing element 7, onto the entrance pupil 10a of the projection lens 10.

In this embodiment, the light impinging on the third light dividing element 7 serves to produce light source images at the focal point position 7b of the third light dividing element 7. Here, the imaging magnification is set to assure that these light source images serve as plural object points in regard to the lens system 8, and that the lights emitted from those plural object points are imaged by the lens system 8 upon the stop (entrance pupil) 10a of the projection lens 10, as plural light source images.

In this embodiment, the cylindrical lenses which constitute the light dividing element 7 comprise those lenses all having the same focal length. Therefore, in each cylindrical lens, a light ray emitted from a predetermined position from the center of the cylindrical lens has the same angle. Thus, the light rays can be superposed one upon another, at a single point on the mask 9. The size of each cylindrical lens is determined to avoid interference, such that the intensities are added and averaged upon the mask 9. Namely, the flattening of light intensity is accomplished. The degree of this flattening is dependent upon the light division number, and it may be determined in accordance with the uniformness required. The division number may preferably be an odd number. This is because the shape of the processed workpiece is significantly influenced by the light at the central portion of the light dividing element. In the case of an even number, the shape of the processed workpiece is determined in accordance with the intensity balance of light rays coming from the opposite sides of a perpendicular axis, as viewed from the workpiece, so that, if the balance is destroyed, a desired shape is not obtainable. Thus, it is important to determine the outline of the shape beforehand, in connection with the center of the light dividing element.

As described above, in this embodiment, the illumination system with respect to the X-Y section provides a Koehler illumination system.

In the X-Z section of FIG. 2, on the other hand, the laser light from the laser light source 1 is reflected by the mirrors 2 and 3, and it enters the enlargement optical system 4. With this enlargement optical system 4, the light is expanded in the Z direction. The magnification is adjusted so that, as it is emitted, the size in the Z direction is approximately the same as that in the Y direction. The light emitted from the enlargement optical system 4 is divided, with respect to the Z direction, by the first light dividing optical system 5 into plural light beams. These divided light beams are than collected at the focal point positions of the cylindrical lenses, constituting the light dividing optical element 5.

In this embodiment, each cylindrical lens has a positive refracting function. The light emitted from the first light dividing element 5 then enters the second light dividing element 6. Here, each of the cylindrical lenses of the first and second light dividing optical elements 5 and 6 has an own reference position whereat it functions to define an afocal system. More specifically, in order that an afocal system is defined through a combination with a cylindrical lens of the first light dividing element, placed at a certain height, there is a cylindrical lens in the second light dividing element, placed at the same height. There are combinations of the same number as the light division number. The cylindrical lenses constituting the first light dividing element 5 have a positive refracting function, and thus the cylindrical lenses constituting the second light dividing element 6 also have a positive refracting function.

While the light is divided into plural light beams by means of the first and second light dividing elements 5 and 6 as described above, since the first and second light dividing elements 5 and 6 are interrelated to provide an afocal system, there is essentially no difference from the state where light is not divided. However, if the afocal relation is disconnected, then each light emitted from the light dividing element 6 has a certain angle. The afocal relation may be disconnected, as an example, by changing the spacing between the first and second light dividing elements 5 and 6. With such interval changing, however, the heights of the central axes of the paired cylindrical lenses of the light dividing elements 5 and 6, which lenses constitute the afocal system, are unchanged. Namely, the light rays passing through the central axes are emitted without any change. Here, the number of light division through the light dividing elements 5 and 6, may preferably be an odd number, as has been described with reference to FIG. 1. Thus, the cylindrical lenses of each of the first and second light dividing element are of an odd number of three, in this example.

The light emitted from the second light dividing element then passes through the third light dividing element 7 and the lens system 8, and it impinges on the mask 9.

As described with reference to the Y direction in FIG. 1, the mask 9 is disposed at the rear focal point position of the lens system 8. Therefore, the light rays in each light beam emitted from the second light dividing element 6, being parallel to each other, are collected by the lens system 8 upon the mask 9. Observing a change in an illumination region upon the mask 9 with respect to the Z direction to be produced by changing the spacing between the first and second light dividing element 5, since the mask 9 position is at the rear focal point position of the lens 8, the central light rays of each afocal system, being parallel to each other, are collected toward a single point on the mask 9. Further, since these light rays are parallel also with the optical axis, they intersect with the optical axis, upon the mask 9. Since the central axis is unchanged even for a change in spacing between the first and second light dividing elements 5 and 6, the points of superposition upon the mask 9 are unchanged. Since, however, each light beam emitted from the second light dividing element 6 has an angle corresponding to the change in spacing, the illumination range upon the mask 9 changes accordingly. In summary, as regards the illumination range on the mask 9 in the Z direction, the center is immovable and, at the same time, the illumination region is widened or narrowed symmetrically in response to a change in spacing between the first and second light dividing elements 5 and 6. Namely, both the aspect ratio and the illumination region change. It is to be noted however that there is a limitation for the widening/narrowing. This is because the action causes a defocus of the convergence position of the light collected on the mask 9, with respect to the Z direction. Since the mask 9 is placed between the lens system 8 and the projection lens 10, it is undesirable that, with the defocus, the light convergence point shifts toward the lens surface of the lens system 8 or the projection lens 10. Because this optical system is used in a processing system using a high-energy laser, if the convergence point is close to the lens surface, the lens may be damaged thereby. Thus, the range of defocus should be kept so as not to produce lens damage.

The light emitted from the mask 9 goes through the projection lens 10 and reaches the surface 11 to be processed.

In this embodiment, the optical system with respect to the X-Z plane constitutes a critical illumination system. Thus, the optical system in this embodiment is arranged so that, with respect to the XY plane, a region covering the mask pattern 9a is illuminated uniformly in accordance with Koehler illumination, while, on the other hand, with respect to the X-Z plane, the mask pattern 9a is illuminated with intense laser light in accordance with critical illumination. In synthesis, the mask 9 is illuminated very efficiently.

The laser light which bears a pattern to be reproduced, having been applied thereto by the mask 9, is imaged geometrically upon the workpiece 11 through the projection lens 10, such that grooves of a shape corresponding to the mask pattern 9a are formed on the workpiece 11 at a predetermined magnification.

In this embodiment, as described above, in order for uniformization also in the widthwise direction (Z direction), a pair of cylindrical lens arrays (first and second optical elements) each comprising plural cylindrical lenses of an odd number, for dividing light also with respect to the widthwise direction, are used. Further, also as regards the lengthwise direction (Y direction), a cylindrical lens array is used. With this arrangement, illumination with an aspect ratio of illumination range of 50–90 can be accomplished. Further, at the same time, the light convergence position with respect to the widthwise direction is made variable, by which the illumination range can be determined variably.

While in this embodiment the light dividing element with respect to the Z direction comprises a pair of cylindrical lens arrays having a positive refracting function, one of them may be a cylindrical lens array having a negative refracting function. Further, the afocal system to be defined may have an arbitrary angular magnification, unless it functions to cause excessive reduction to damage the glass material. As regards the aperture size for light division and the magnification of the lens system 8, any values may be used within a range not exceeding the size of the entrance pupil of the projection lens 10.

In accordance with this embodiment of the present invention as described hereinbefore, within an illumination range of an aspect ratio not less than 50, an illumination region can be illuminated uniformly while the size of the illumination region is kept variable. Thus, an illumination system and an optical processing apparatus by which a workpiece can be processed easily and very precisely, can be accomplished.

Further, upon the surface to be illuminated (e.g., mask surface), the intensity distribution is flattened also in regard to the widthwise direction. Thus, changes in processed shape due to a change in the mask position are reduced. This effectively decreases the necessity of adjustment of the processing apparatus, such that an illumination system and an optical processing apparatus having a higher reliability are accomplished.

Figure 3:
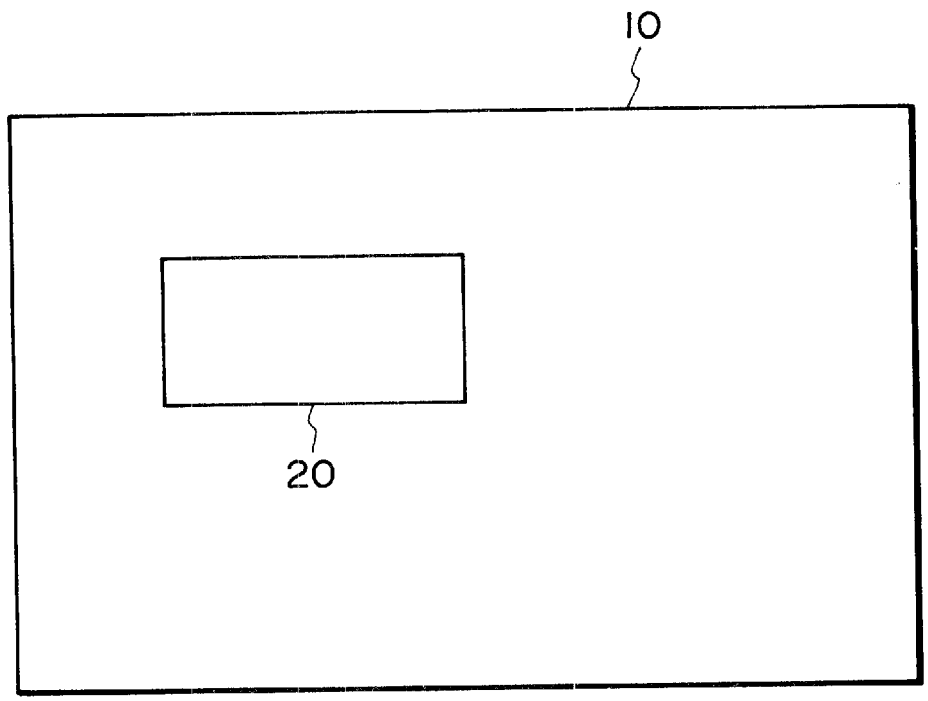
FIG. 3 is a schematic view of an ink-jet printer having an orifice plate, produced by using the optical processing apparatus of the first embodiment.
Figure 4:
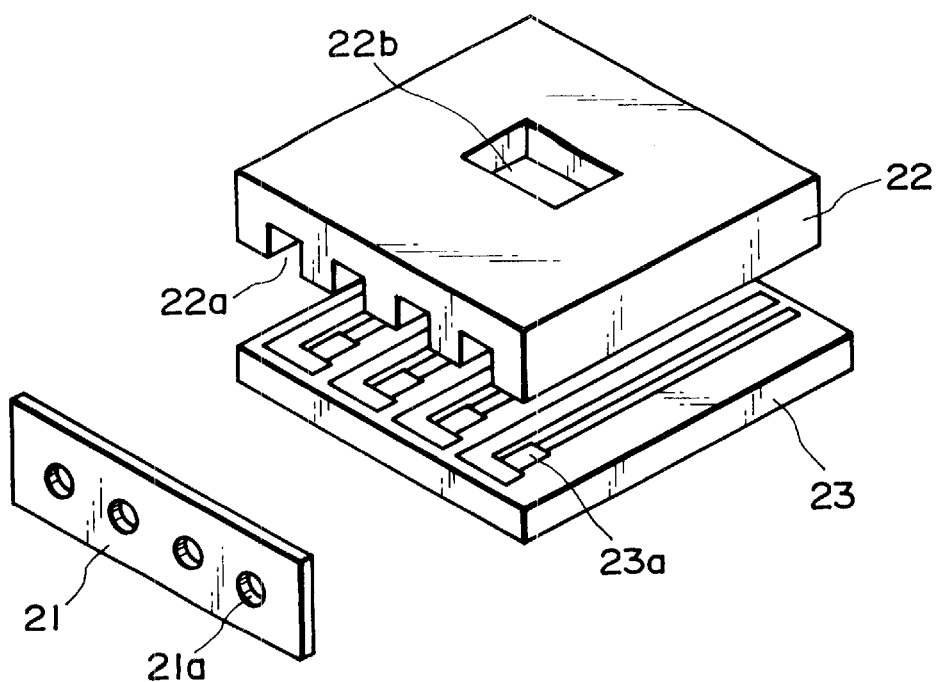
FIG. 4 is a schematic view of an ink-jet recording head of the ink-jet printer.

Referring now to FIGS. 3 and 4, an embodiment of an ink-jet type printer, having an orifice plate produced by use of an optical processing apparatus such as described above, will be explained.

FIG. 3 is a schematic view for explaining a general structure of an ink-jet printer of this embodiment. Denoted in FIG. 3 at 10 is a major assembly of the printer. Denoted at 20 is an ink-jet recording head having an orifice plate. In this ink-jet printer of this embodiment, a sheet of paper is loaded through a paper supplying mechanism (not shown) of the printer major assembly 10, and printing (recording) to the paper sheet is performed by very small ink drops discharged from the ink-jet recording head 20. In the recording head of this embodiment, bubbles are produced in response to instant heat generation at a heating element disposed in the path of ink liquid, and, through these bubbles, ink drops are discharged out of discharging ports.

FIG. 4 is a schematic view of the ink-jet recording head 20. Denoted in FIG. 4 at 21 is an orifice plate having a plurality of orifices 21a as ink discharging ports. Denoted at 22 is a top plate having ink flow-passage grooves 22a and an ink supply port 22b. Denoted at 23 is a heater board having heat generating elements 23a for applying heat energies, for ink discharging.

The orifice plate 21 of this embodiment has been produced very precisely by use of the optical processing apparatus of the preceding embodiment. Thus, a good printing quality is attainable with the ink-jet printer of this embodiment.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

an optical system for performing substantially critical illumination of a surface to be illuminated, with respect to a predetermined plane, by use of light from a light source, and also for performing Koehler illumination of the surface with respect to a plane orthogonal to the predetermined plane;

a first optical component having an optical power with respect to the predetermined plane; and a second optical component having an optical power with respect to the predetermined plane, wherein said first and second optical components provide an afocal system and the aspect ratio of an illumination region with respect to the surface to be illuminated is made variable through changing the position of said first and second optical components relative to each other to break the afocal state.

2. An illumination system according to claim 1, wherein said first and second optical components comprise a cylindrical lens array having an optical power with respect to the predetermined plane.

3. An illumination system according to claim 2, wherein the cylindrical array includes cylindrical lenses of an odd number not less than 3.

4. An illumination system according to claim 1, further comprising a third optical component having an optical power with respect to the plane orthogonal to the predetermined plane.

5. An illumination system according to claim 4, wherein said third optical component comprises a cylindrical lens array having an optical power with respect to the plane orthogonal to the predetermined plane.

6. An illumination system according to claim 1, wherein a width of the illumination region with respect to the predetermined plane, upon the surface to be illuminated, differs from a width of an illumination region with respect to the plane orthogonal to the predetermined plane.

7. An optical processing apparatus, comprising:

an illumination system as recited in claim 1, for illuminating a mask having a pattern; and a projection system for projecting the illuminated pattern of the mask onto a substrate, for processing the same.

8. A method of manufacturing an orifice plate, comprising the steps of:

loading a substrate in an optical processing apparatus as recited in claim 7; and illuminating a mask having a plurality of openings arrayed along a certain direction, so that the pattern is projected onto the substrate to produce plural openings therein.

9. An ink-jet printer including an orifice plate as produced in accordance with an orifice plate manufacturing method as recited in claim 8.

* * * * *

UNITED STATES PATENT AND TRADEMARK OFFICE
CERTIFICATE OF CORRECTION

PATENT NO.     : 6,515,694 B1
DATED          : February 4, 2003
INVENTOR(S)    : Masayuki Nishiwaki It is certified that error appears in the above-identified patent and that said Letters Patent is hereby corrected as shown below:

Column 1,
Line 14, "in a" should read -- in an --;
Line 20, "renovations," should read -- innovations, --; and
Line 63, "can not" should read -- cannot --.

Column 3,
Line 49, "look as" should read -- look like --.

Column 4,
Line 59, "than" should read -- then --; and
Line 67, "an" should read -- its --.

Column 5,
Line 2, "is" should read -- be --;
Line 24, "which" should read -- whose --;
Line 27, "division" should read -- divisions --;
Line 31, "element" should read -- elements --; and
Line 67, "shifts" should read -- shift --.

Column 8,
Line 13, "further" should be deleted; and
Line 14, "comprising" should read -- wherein said optical element further comprises --.

Signed and Sealed this

Eighteenth Day of November, 2003

JAMES E. ROGAN
*Director of the United States Patent and Trademark Office*